United States Patent [19]

Snow et al.

[11] 3,951,327

[45] Apr. 20, 1976

[54] CERAMIC TO METAL SEAL

[75] Inventors: Gary S. Snow; Paul D. Wilcox, both of Albuquerque, N. Mex.

[73] Assignee: The United States of America as represented by the United States Energy Research and Development Administration, Washington, D.C.

[22] Filed: Jan. 28, 1975

[21] Appl. No.: 544,716

[52] U.S. Cl. ............................. 228/121; 228/188
[51] Int. Cl.² .................................. B23K 19/00
[58] Field of Search .......... 228/121, 122, 123, 124, 228/188

[56] References Cited
UNITED STATES PATENTS

| | | | |
|---|---|---|---|
| 3,036,674 | 5/1962 | Branin | 228/122 X |
| 3,182,845 | 5/1965 | Culbertson | 228/122 X |
| 3,487,536 | 1/1970 | Goldstein | 228/124 |
| 3,754,674 | 8/1973 | Wesoloski | 228/122 X |

FOREIGN PATENTS OR APPLICATIONS

| | | | |
|---|---|---|---|
| 986,244 | 3/1965 | United Kingdom | 228/122 |

*Primary Examiner*—Al Lawrence Smith
*Assistant Examiner*—K. J. Ramsey
*Attorney, Agent, or Firm*—Dean E. Carlson; Dudley W. King; Richard E. Constant

[57] ABSTRACT

Providing a high strength, hermetic ceramic to metal seal by essentially heating a wire-like metal gasket and a ceramic member, which have been chemically cleaned, while simultaneously deforming from about 50 to 95 percent the metal gasket against the ceramic member at a temperature of about 30 to 75 percent of the melting temperature of the metal gasket.

11 Claims, 9 Drawing Figures

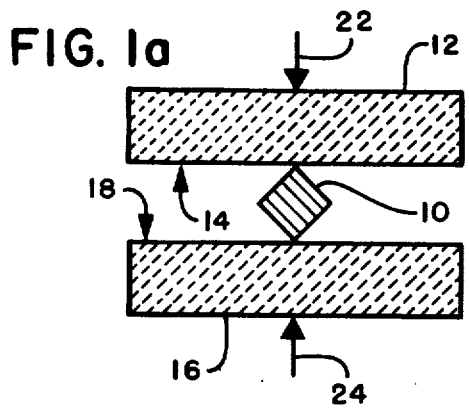
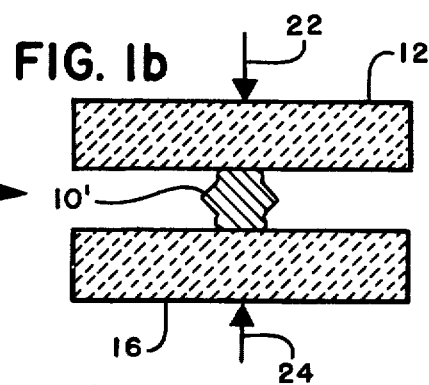
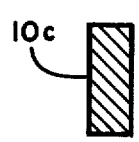
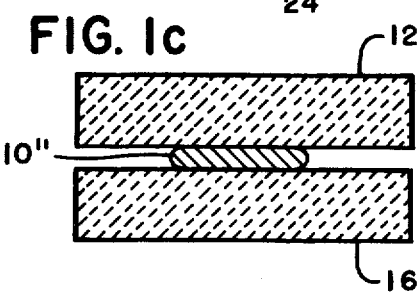
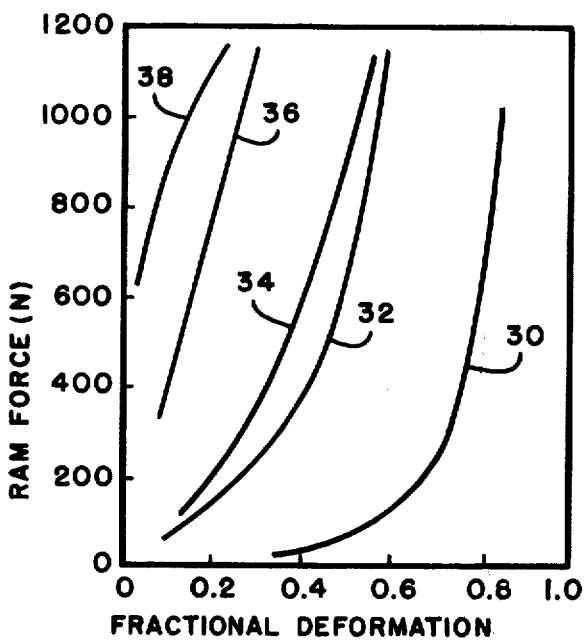
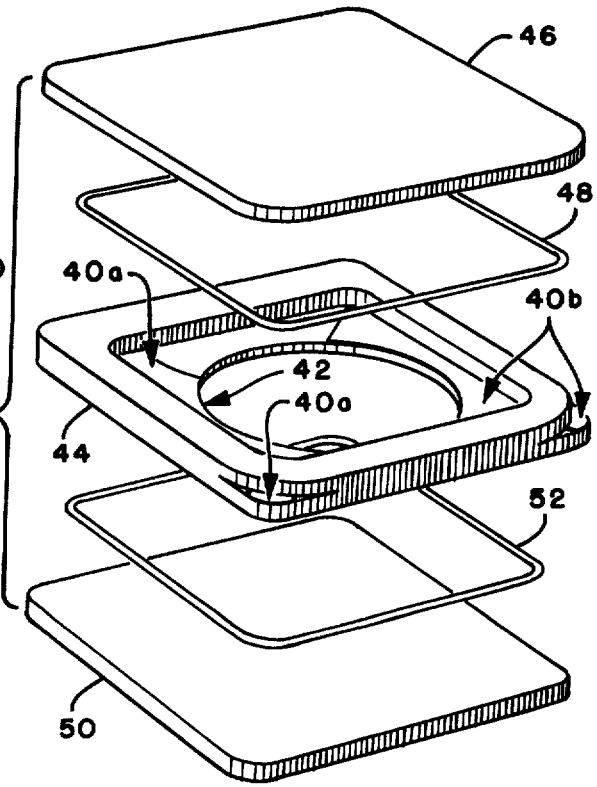
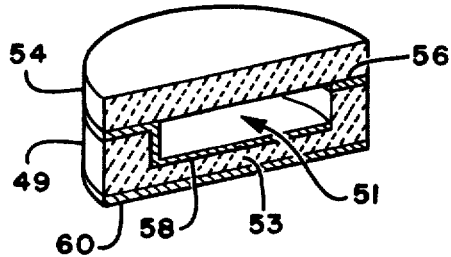

CERAMIC TO METAL SEAL

BACKGROUND OF INVENTION

Ceramic materials, such as aluminum oxide, zirconium oxide, beryllium oxide, and various glasses are being increasingly used for packaging of electronic components, as substrates for electronic devices, as envelopes for electron and other discharge tubes, and the like, due to the desirable high temperature and electrical characteristics and extremely low gas permeation features of these ceramics. In many of these applications, a hermetic, high strength seal must be provided between the ceramic and some other material or another ceramic member. In order to utilize the ceramic and seal in various environments to which it is particularly adaptable, it is desirable that the seal be made of a relatively high temperature material which may also exhibit relatively low gas permeation rates. Such sealing materials are often metals like molybdenum-manganese, gold, chrome-gold, copper, platinum, or glasses, or high temperature organic resins.

Quartz crystal resonators, which are utilized extensively in oscillators for radio and navigation systems and other applications requiring frequency control, are commonly enclosed in hermetically sealed packages not only for mechanical protection but also to prevent aging and thermal hysteresis brought about by changes in mass of a resonator due to variations in the amount of adsorbed gas resulting from temperature and pressure fluctuations. In the packaging of such resonators, it is desirable to use a ceramic enclosure for housing the resonator which includes a ceramic member hollowed out for receiving the resonator and one or more cover or lid members for completing the package. A high strength hermetic seal is then desired between each of the contiguous surfaces of the various ceramic elements of the housing.

It has been felt that in order to achieve the desired high strength and hermetic sealing of such ceramic members, the ceramic surfaces between or against which the seal is to be effectuated must first be coated with a metal or glass layer having a high degree of adherence to the ceramic. This adherence is achieved by various complex and expensive metalization or coating techniques including vapor deposition, ion plating, sputtering and the like. Adherence may be further enhanced by diffusion or reaction between the coating and the substrate. The metalized or coated surfaces are then brought into contact with another metalized or coated surface or an intermediate metal gasket and suitable temperatures, normally greater than 600°C, and pressure applied to effect an interbonding between the metal gasket and the metalization layers or between the coatings. The overall sealing process, as is well known, may be very time consuming and expensive to achieve and often require an interdiffusion or reaction zone between the respective materials to achieve any seal strength.

It has been suggested that good bonding may also be achieved by bringing ceramic surfaces into contact with certain metals in an ultra-high vacuum environment in which the surfaces to be sealed are initially atomically cleaned, that is, effecting the removal of all contaminants including chemically as well as physically adsorbed gases. Such requirements present an added burden to the achievement of the seal due to the difficulties in achieving atomic cleanliness and the cost and complexities of the high-vacuum equipment which must be utilized, as well as the complications which necessarily follow therefrom. This becomes even more difficult to achieve when it is desired to fill the enclosure which is to be sealed with a gas. The gas environment in and/or around the ceramic members and gaskets will inherently be at least partially adsorbed onto the material surfaces and prevent the accomplishment of the previously required atomic cleanliness.

SUMMARY OF INVENTION

In view of the above it is an object of this invention to provide a high-strength, hermetic ceramic to metal seal.

It is a further object of this invention to provide a method for achieving a high-strength, hermetic seal in a gaseous atmosphere.

Various other objects and advantages will appear from the following description of the invention, and the most novel features will be particularly pointed out hereinafter in connection with the appended claims. It will be understood that various changes in the details, materials and arrangements of the parts, which are herein described and illustrated in order to explain the nature of the invention, may be made by those skilled in the art within the principles and scope of the invention as expressed in the appended claims.

The invention relates to a method for providing a metal to ceramic seal in which a wire-like metal gasket is highly deformed at a temperature near its annealing temperature against the surface of a ceramic member in either a gaseous or vacuum atmosphere.

DESCRIPTION OF DRAWING

The invention is illustrated in the accompanying drawing wherein;

FIGS. 1a, 1b, and 1c are cross-sectional views illustrating a ceramic to metal seal being achieved by the process of this invention;

FIGS. 2a, 2b and 2c are cross-sectional views of some alternate gasket shapes which may be utilized in this process;

FIG. 3 is a graph showing the fractional deformation of various wire-like gasket materials as a function of the force applied thereto when the gaskets are subjected to different temperatures;

FIG. 4 is a perspective view of a typical quartz crystal resonator package exploded so as to illustrate the positions of the various ceramic elements and gaskets; and FIG. 5 is a sectioned perspective view of a zirconium oxide enclosure with platinum gaskets for an oxygen probe application.

DETAILED DESCRIPTION

The high-strength and hermetic seal of this invention may be achieved in the manner illustrated by the sequence of operations shown in FIGS. 1a, 1b and 1c. In the illustration a seal is being accomplished between each of two ceramic elements and a single gasket intermediate thereto, it being understood that a similar seal may be achieved between any ceramic member and a gasket suitably formed and shaped.

The elongated, wire-like metal gasket 10 shown in cross section is positioned adjacent to a first ceramic element or member 12 against the surface 14 to which a seal is to be formed and a second ceramic member 16 against its sealing surface 18. The surfaces 14 and 18 should be relatively smooth and comforming and have all foreign material removed therefrom by appropriate cleansing thereof. The amount or degree of cleanliness, it has been found, is not highly critical and can be accomplished by a physical brushing or wiping together with chemical cleaning with suitable solvents such as trichloroethylene, acetone and methanol. Gasket 10 should also be likewise cleaned. It has further been found that the respective surfaces against which the seal is to be made do not have to be atomically cleaned, that is, all adsorbed gases do not have to be removed therefrom.

The gasket is preferably shaped so as to have a very small area of initial contact with the surface to which it is to be sealed so as to insure a large amount of deformation during sealing without requiring excessively high deformation forces. The gasket 10 should thus be very narrow along its contact with the ceramic surface with an increasing width in a direction perpendicular to the ceramic surface to provide structural strength to prevent unwanted collapsing or folding of the gasket as the deformation progresses. The preferred shaped gasket may be one having a "diamond" or generally triangular shaped cross section, as indicated by the gasket 10 in FIG. 1a, with the pointed edge of the diamond or triangle in initial contact with the ceramic member. Where a seal is to be made between two ceramic members simultaneously with a single gasket therebetween, as indicated in FIG. 1a, the gasket may have the diamond-shape cross section with diagonally opposite corners in contact with each of the surfaces 14 and 18 of ceramic members 12 and 16. Alternate configurations of gasket 10 which may be utilized are shown, by way of example, in FIGS. 2a, 2b and 2c by gaskets 10a, 10b and 10c. Gasket 10a has a generally elliptical-shaped cross section thus providing two surfaces along the narrow or small radius ends thereof, against which a seal may be provided. The generally round shape of gasket 10b may be more readily manufactured than other gasket shapes but with less effective deformation since the amount of gasket material increases more rapidly in the direction away from the surface against which the seal is being formed. A gasket having a shape similar to or like gasket 10c, may also be utilized in some applications where care is exercised to minimize bending of the gasket during its deformation.

For hermetic seal applications the gasket 10 should be made of a material having a gas permeation rate comparable to that of the ceramic elements or members taking into consideration the ultimate width of the seal after deformation of the gasket, e.g. the length through which gas must permeate, compared to the shortest permeation path through the ceramic members. A particularly attractive gasket material which exhibits good deformation characteristics and low gas permeation rates is aluminum. In addition, aluminum is a metal which is highly stable at relatively high temperatures and is readily available at low cost. Aluminum has a hydrogen permeability of about $3 \times 10^{-28}$ mole/second.meter.Pascal$^{1/2}$ (mol/s.m.Pa$^{1/2}$) at room temperature. Other gasket materials which may be utilized, depending upon the ceramic being used and the desired operating conditions of temperature, pressure and the like of the finished seal, as well as the processing temperatures to form the seal, may include copper, platinum, gold, silver, titanium, and the like and alloys with these metals. Some of these materials, such as aluminum, may be more readily deformed at lower processing temperatures while others, such as platinum, may require higher processing temperatures and consequently also allow higher operating temperatures.

The gaskets may be formed into the desired cross-sectional shape by drawing the gasket through an appropriate die under suitable conditions. Where the finished gasket must be in an annular or closed form, the so-shaped gasket may be cut to an appropriate length and then joined at the ends, however with attendent difficulties. For closed or annular gaskets, it may be preferable to provide the desired cross section at the same time that the overall gasket shape is being produced, such as by a punch and die set or by chemical machining or milling of a metal sheet. The gasket surfaces need not be smooth, as shown, but may be roughened and irregular, which is often an inherent characteristic of chemically machined gaskets, to further limit the initial contact area of the gasket with the ceramic sealing surface, the irregularities providing the initial contact.

The ceramic members, such as members 12 and 16, are preferably made from a material having a low gas permeation rate and which is of generally low cost, relatively high strength, and readily fabricated into possibly complex shapes. A particularly suitable ceramic for this purpose is aluminum oxide ($Al_2O_3$) which may typically exhibit a helium permeabiliy of about $10^{-23}$ mol/m.s.Pa$^{1/2}$. Other ceramics which may be used include zirconium oxide.

Seals obtained using this method have not shown any indications of reaction zones or the formation of intermediate reaction products between the metal and ceramic and it is believed that these intermediate layers or zones are not necessary to accomplish a seal by the method herein described. This conclusion together with the results obtained with the range of metals used as gaskets and the oxides used suggest that various glasses as well as borides, silicides, nitrides and carbides of metals such as aluminum, zirconium, beryllium, tungsten and titanium, with similar mechanical surfaces could also be sealed.

After a suitable chemical cleaning of the ceramic and gasket materials as described above and assembly thereof into the desired configuration, such as indicated in FIG. 1a, the assembly may be heated to a suitable temperature, as indicated by heat 20, to enhance the deformability of the gasket 10. The temperature of heat 20 may generally be near the annealing temperature of the metal forming gasket 10, though lower temperatures may sometimes be utilized if gasket 10 can be sufficiently deformed. The temperature utilized will most often fall within the range of from about 30 to about 75 percent of the melting temperature of the metal gasket. For example, with aluminum as the gasket 10 material, the assembly may be heated to from about 200° to 450°C. For copper, this temperature may be about 325°C while for platinum it may be around 1000°C. This heating and subsequent operations of the seal fabrication may be carried out in any appropriate gaseous atmosphere or in a vacuum depending upon the materials being utilized for the gasket and ceramic and the requirements of the structure being fabricated, for example, if the seal being produced is forming an enclosure in which a particular atmosphere or vacuum is to be enclosed. The production of the desired high-strength and hermetic seal has been carried out in helium and in air at about $10^5$ Pa, and in high vacuums at about $10^{-6}$ Pa.

After the respective elements of the seal have been brought to the desired temperature, a deformation pressure may be applied across the gasket 10, such as indicated by pressure arrows 22 and 24, by an appropriate press or the like. It has been found that pressing from about 10 minutes to about 1 hour is sufficient to effect a seal, but extensively longer time periods may be utilized if desirable. Since the forces produced along the interface between the gasket 10 and sealing surfaces 14 and 18 of ceramic members 12 and 16 will be, at least initially, very high due to the configuration of gasket 10, as described above, the gasket 10 will deform initially along this contact area and will progress outwardly in both directions perpendicular to the applied pressing force as additional gasket material is brought into contact with the ceramic members, as shown in FIG. 1b by the partially deformed gasket 10'. It can be seen that with the preferred triangular or diamond shaped gasket, the gasket as it is being deformed, may produce a relatively uniform and strong scraping action by the metal layer and present fresh metal against the sealing surfaces. This action, as it continues to the final deformation stage as indicated in FIG. 1c, it has been found, produces a high-strength bond over a substantial portion of the surface of the deformed gasket without requiring the excessively high temperatures normally required for diffusion and reaction type bonding as described by prior art and without requiring the provision of atomically clean surfaces before producing the bond. The pressing should be continued until the gasket 10 is extensively or massively deformed from about 50 percent to about 95 percent, that is fractionally deformed to about 50 to 5 percent of its original thickness in a direction perpendicular to the ceramic sealing surface.

FIG. 3 illustrates fractional deformation curves for various gasket materials and temperatures as the force applied to the gasket is increased. For these curves all gaskets were formed from round wires of about 0.25 millimeters in diameter and about 15.2 millimeters long. Curve 30 represents an aluminum wire which is heated at 300°C while curve 32 represents a similar aluminum wire heated to 27°C. Curves 34 and 36 represent copper wires which were annealled before deformation and which were then deformed at 317°C and 27°C respectively. Curve 38 represents copper wire which had not been previously annealed and which was then deformed at 27°C. In order to achieve high-strength seals, it has been found that the gasket material should be deformed from about 50 to 95 percent and that such cannot be achieved without excessive forces unless the gasket is heated to the desired temperature set forth above.

Various ceramic plates were sealed with a suitable metal gasket under various conditions and the seal strength measured. Some of these seals were also tested for their leak rate using Krypton tracer techniques. The various results achieved are set forth in the following table:

| Gasket | Ceramic | Sealing Temp. (°C) | Sealing Time (Min.) | Final Sealing Stress (MPa) | Seal Strength (MPa) | Sealing Atmosphere | Deformation % |
|---|---|---|---|---|---|---|---|
| Al | $Al_2O_3$ | 277 | 10 | 143 | 3.16 | He | 81 |
| Al | $Al_2O_3$ | 310 | 60 | 53.9 | 8.60 | He | 76 |
| Al | $Al_2O_3$ | 310 | 60 | 53.9 | 10.1 | He | 76 |
| Cu | $Al_2O_3$ | 335 | 60 | 164 | 15.4 | He | 63 |
| Cu | $Al_2O_3$ | 318 | 60 | 181 | 10.1 | He | 64 |
| Al | $Al_2O_3$ | 340 | 60 | 75 | 28.0 | He | 77 |
| Al | $Al_2O_3$ | 340 | 60 | 75 | 74.5 | He | 77 |
| Al | $Al_2O_3$ | 340 | 60 | 75 | Leak Tested | He | 77 |
| Al | $Al_2O_3$ | 340 | 60 | 75 | Leak Tested | He | 77 |
| Al | $Al_2O_3$ | 340 | 60 | 75 | 44.8 | He | 77 |
| Al | $Al_2O_3$ | 340 | 60 | 75 | 22.1 | He | 77 |
| Al | $Al_2O_3$ | 340 | 60 | 75 | Leak Tested | He | 77 |
| Al | $Al_2O_3$ | 340 | 60 | 75 | 46.9 | He | 77 |
| Al | $Al_2O_3$ | 340 | 60 | 75 | 42.7 | He | 77 |
| Pt | $ZrO_2$ | 1010 | 60 | 65 | 30.3 | Air | 70 |
| Al | $Al_2O_3$ | 360 | 60 | 21 | 47.7 | $10^{-4}$ Pa | 69 |
| Al | $Al_2O_3$ | 360 | 60 | 21 | Leak Tested | $10^{-4}$ Pa | 69 |

The first three seals in the table utilized 9999 percent pure aluminum while the remaining aluminum seals utilized 990 percent pure aluminum.

A package which may be utilized to house a quartz crystal resonator is shown in FIG. 4 in which the resonator (not shown) may be supported on suitable feed-through pads 40a and 40b within an ovate or circular window or hollowed out central opening 42 of a mounting frame 44 formed from alumina or the like ceramic. The pads 40a and 40b are coupled between opening 42 and the exterior of the package within frame 44 to provide electrical contact with the resonator. The package enclosure is formed by positioning a first lid 46 over one side of frame 44 with a closed gasket 48 therebetween directly against adjoining or abutting surfaces and a second lid 50 over the other side of frame 44 with a second closed gasket 52 therebetween also directly against adjoining or abutting surfaces. After respective elements are cleaned and the resonator suitably supported and bonded on pads 40a and 40b within frame 44 and the respective lids and gaskets as embled in the configuration illustrated, the entire assembly may be heated and simultaneously pressed as described above to form the desired package. The respective ceramic package elements 44, 46 and 50 and gaskets 48 and 52 which are of generally rectangular shape may be provided, as shown, with rounded or curved corners to enhance package and seal strengths. Since in some applications it may be desirable that the window 42 of frame 44 be filled with a suitable gas to enhance the rate of thermal stabilization of the resonator, the sealing operations may be carried out within desired gas atmosphere so as to seal the gas therein. In other applications, where stability is of primary consideration, the process may be carried out under vacuum to thus provide an evacuated volume within window 42. Three of these packages formed in helium by the process described above using alumina ceramic parts with aluminum gaskets of about 0.25 millimeters in diameter chemically machined from an aluminum sheet into the form generally shown in FIG. 2a by gasket 10a produced high-strength seals having leak rates of from about $1.3 \times 10^{-14}$ mols to better than $4.5 \times 10^{-17}$ mol/s.

FIG. 5 illustrates an oxygen probe which includes a zirconium oxide member 49 having a hollowed-out cavity 51 forming an oxygen diffusion wall 53 in member 49. Cavity 52 is covered by a lid 54 and sealed by a platinum gasket 56 which is deformed and sealed between lid 54 and member 49 by the process described above. Suitable electrodes 58 and 60 may be disposed on opposite surfaces of wall 53 to effect the desired oxygen diffusion through wall 53 by application of electric potentials to the electrodes. Electrical connection to electrode 58 may be provided through gasket 56, as shown. The arrangement provides hermetically sealed volume within cavity 51 into and from which oxygen may be controllably diffused through wall 53.

What is claimed is

1. A method for providing a high-strength, hermetic, ceramic to metal seal and bond consisting essentially of chemically cleaning a surface of a ceramic member to be joined; positioning a wire-like metal gasket directly on said ceramic surface; then heating said ceramic member and said gasket to a temperature of from about 45 percent to about 70 percent of the melting temperature of said metal gasket; and thereafter while maintaining said temperature simultaneously extensively deforming said heated gasket from about 50 percent to about 95 percent against said surface to seal and bond said gasket to said ceramic.

2. The method of claim 1 wherein said ceramic is zirconium oxide and said metal gasket is platinum.

3. The method of claim 1 wherein said ceramic is aluminium oxide and said metal gasket is selected from the group consisting of aluminum and copper.

4. The method of claim 1 including immersing said ceramic and gasket in a gaseous atmosphere during said pressing.

5. The method of claim 4 wherein said gaseous atmosphere is helium.

6. The method of claim 4 including an additional ceramic member having a surface to be joined overlying said first mentioned surface, said gasket being sandwiched between said surfaces; and wherein said pressing extensively deforms said gasket simultaneously against both of said surfaces effecting a seal between said ceramic members at said surfaces.

7. The method of claim 1 wherin said gasket has an increasing thickness in a direction perpendicular to said ceramic surface and said processing extensively deforms said gasket progressively along said increasing thickness.

8. The product formed by the process of claim 1.

9. A method for effecting a high-strength and hermetic seal and bond to enclose a gas filled alumina ceramic housing holding a quartz resonator therein consisting essentially of chemically cleaning the ceramic elements which form said housing; stacking the ceramic elements into the housing configuration; interleaving metal wire-like gaskets between and directly against abutting surfaces of said ceramic elements, said gaskets being selected from the group consisting of aluminum and copper; immersing said ceramic elements and interleaved gaskets in a gaseous atmosphere; then while in said gaseous atmosphere heating said ceramic members and interleaved gaskets to a temperature of from about 280° to 450°C; and thereafter while maintaining said temperature applying pressure to press said ceramic elements against said gaskets extensively deforming said gaskets from about 50 percent to about 95 percent against said abutting surfaces and continuing to apply said pressure for from about 10 minutes to about 1 hour while maintaining said temperature to form said gas tight seal and gas filled bonded housing.

10. The method of claim 9 including hollowing out a central portion of one of said ceramic elements for holding said resonator and forming a planar sealing surface on said hollowed out ceramic element and on ceramic element cover portions overlying said hollowed central portion, and forming said gaskets into annular units encircling said central portion and resonator between said hollowed out element and said cover portions.

11. The product formed by the process of claim 9.

* * * * *